United States Patent
Lee et al.

(10) Patent No.: US 12,351,940 B2
(45) Date of Patent: Jul. 8, 2025

(54) LINER AND EPITAXIAL REACTOR COMPRISING SAME

(71) Applicant: SK SILTRON CO., LTD., Gumi-si (KR)

(72) Inventors: Se Ri Lee, Gumi-si (KR); Seung Chul Back, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 329 days.

(21) Appl. No.: 17/663,602

(22) Filed: May 16, 2022

(65) Prior Publication Data

US 2023/0257903 A1 Aug. 17, 2023

(30) Foreign Application Priority Data

Feb. 17, 2022 (KR) ........................ 10-2022-0020611

(51) Int. Cl.
- *C23C 16/40* (2006.01)
- *C23C 16/458* (2006.01)
- *C30B 25/12* (2006.01)

(52) U.S. Cl.
CPC .......... *C30B 25/12* (2013.01); *C23C 16/4583* (2013.01)

(58) Field of Classification Search
CPC ......... C30B 25/12; C30B 25/14; C30B 25/08; C23C 16/4583; C23C 16/45502; C23C 16/45563; C23C 16/4585; C23C 16/45591; C23C 16/45561; H01J 37/3244; H01J 37/32449
USPC ........................ 118/715; 156/345.33, 345.34
See application file for complete search history.

(56) References Cited

U.S. PATENT DOCUMENTS

| | | | | |
|---|---|---|---|---|
| 5,792,272 | A * | 8/1998 | van Os | H01J 37/3244 118/723 R |
| 8,980,005 | B2 * | 3/2015 | Carlson | C23C 16/45578 118/715 |
| 9,117,670 | B2 * | 8/2015 | Abedijaberi | C23C 16/45561 |
| 2004/0050325 | A1 * | 3/2004 | Samoilov | C23C 16/45561 156/345.33 |

(Continued)

FOREIGN PATENT DOCUMENTS

KR  10-1487411 B1  1/2015

OTHER PUBLICATIONS

Korean Office Action for KR Application No. 10-2022-0020611 dated Nov. 23, 2023, 9 pages.

*Primary Examiner* — Rudy Zervigon

(74) *Attorney, Agent, or Firm* — Lewis Roca Rothgerber Christie LLP

(57) ABSTRACT

According to an aspect of the present disclosure, there is provided a liner of an epitaxial reactor, including a lower body including an entrance stepped portion which is disposed on an upper end of one side of an outer side surface of the lower body and through which a source gas is introduced, a plurality of lower partitions disposed apart from each other on the entrance stepped portion, an upper body disposed on the lower body to face the lower body and including an entrance cover part forming a flow path which is interposed between the entrance stepped portion and the entrance cover part and through which the source gas is introduced, and a plurality of upper partitions disposed apart from each other on the entrance cover part, wherein the upper partitions are more densely disposed in both side portions than in a central portion of the entrance cover part.

9 Claims, 8 Drawing Sheets

(56) References Cited

U.S. PATENT DOCUMENTS

| | | | | |
|---|---|---|---|---|
| 2004/0099378 A1* | 5/2004 | Kim | ............... | C23C 16/4558 |
| | | | | 156/345.33 |
| 2006/0112876 A1* | 6/2006 | Choi | ............... | H01J 37/3244 |
| | | | | 156/345.33 |
| 2007/0281084 A1* | 12/2007 | Hirosawa | ......... | C23C 16/45565 |
| | | | | 427/248.1 |
| 2008/0220150 A1* | 9/2008 | Merry | ............... | C30B 25/14 |
| | | | | 427/314 |
| 2010/0272892 A1* | 10/2010 | Kobayashi | ........ | C23C 16/45574 |
| | | | | 118/665 |
| 2013/0014698 A1* | 1/2013 | Kools | ............... | C23C 16/45591 |
| | | | | 239/589 |
| 2014/0224174 A1* | 8/2014 | Abedijaberi | ...... | H01J 37/32477 |
| | | | | 138/37 |
| 2014/0273409 A1* | 9/2014 | Pitney | ............... | C23C 16/45587 |
| | | | | 118/715 |
| 2014/0273410 A1* | 9/2014 | Abedijaberi | ...... | C23C 16/45578 |
| | | | | 118/715 |
| 2014/0273411 A1* | 9/2014 | Abedijaberi | ...... | H01L 21/02381 |
| | | | | 438/478 |
| 2014/0273503 A1* | 9/2014 | Pitney | ............... | C23C 16/45563 |
| | | | | 438/758 |
| 2015/0292088 A1* | 10/2015 | Canizares | ......... | C23C 16/45504 |
| | | | | 118/715 |
| 2016/0068997 A1* | 3/2016 | Lau | ............... | C23C 16/4408 |
| | | | | 239/132 |
| 2017/0271184 A1* | 9/2017 | Brashear | ............... | G05D 11/132 |
| 2020/0040458 A1* | 2/2020 | Ma | ............... | C23C 16/52 |
| 2021/0147980 A1 | 5/2021 | Abedijaberi et al. | | |

\* cited by examiner

LINER AND EPITAXIAL REACTOR COMPRISING SAME

CROSS-REFERENCE TO RELATED APPLICATIONS

This application claims priority to and the benefit of Korean Patent Application No. 2022-0020611, filed on Feb. 17, 2022, the disclosure of which is incorporated herein by reference in its entirety.

TECHNICAL FIELD

The present disclosure relates to a liner which allows an epitaxial layer to be grown with a uniform thickness by improving flow straightness of a source gas flowing to a wafer edge and an epitaxial reactor including the same.

BACKGROUND

Wafers used as materials for manufacturing semiconductor elements are produced through a slicing process of slicing a single crystal silicon ingot into thin wafer forms, a lapping process of lapping the wafers to have desired thicknesses and improving flatness, an etching process for removing damage from the wafers, a polishing process for improving mirror-like finishing and flatness of surfaces, a cleaning wafer process for removing contaminants on the surfaces of the wafers, and the like.

An epitaxial wafer is a wafer on which an epitaxial film is formed on a polished wafer through a chemical vapor deposition method in a chamber at a high temperature of 1000° C. or more. A thickness of the epitaxial film is affected by a flow rate of a reaction gas introduced into a processor chamber, a volume of the chamber, and heating of the chamber.

A liner and an epitaxial reactor disclosed in Korean Patent No. 1487411 (Applied on Sep. 2, 2013) include a body including a first stepped portion which is disposed at an upper end of one side of an outer side surface thereof and through which a source gas is introduced and liner partitions disposed apart from each other on the first stepped portion, wherein the first stepped portion has a step with respect to the outer side surface of the body and includes a first surface in contact with an upper surface of the body and a second surface positioned between the outer side surface of the body and the first surface; at least one of the liner partitions has a different inclination angel and coupled to the first surface and the second surface of the first stepped portion, the inclination angle is an angle formed between the liner partition and a reference line, and the reference line is a line perpendicular to a first boundary line at which the second surface of the first stepped portion meets the outer side surface of the body.

Accordingly, a flow of the source gas can be controlled according to an installation structure of the partitions, and a thickness of an epi-layer grown on a wafer can be controlled.

FIGS. 1 and 2 are views illustrating a flow of a source gas at an entrance and an inner portion of an epitaxial reactor according to a conventional technology, and FIG. 3 is a graph showing a thickness of an epi-layer of a wafer manufactured in the epitaxial reactor according to the conventional technology.

In the conventional epitaxial reactor, the source gas is supplied through an injector forming a central flow path and both sides flow paths, and even when the source gas passes a baffle and an insert, as illustrated in NG. 1, the flow has a tendency to be relatively weakened at both sides of the entrance of the epitaxial reactor.

Even when the conventional epitaxial reactor includes the partitions on a lower liner as described above, as illustrated in FIG. 2, the flow also has a tendency to be relatively weakened at both sides in the epitaxial reactor.

Accordingly, even when an epi-wafer is manufactured in the conventional epitaxial reactor, as illustrated in FIG. 3, there are problems that a thickness of the epi-layer is very thin at both sides of the wafer, and it is difficult to uniformly control the thickness of the epi-layer over the entire wafer.

SUMMARY

Technical Problem

The present disclosure is directed to solving the above-described problems and other problems.

The present disclosure is also directed to providing a liner allowing an epi-layer to be grown with a uniform thickness by improving flow straightness of a source gas flowing to a wafer edge and an epitaxial reactor including the same.

Technical Solution

According to an aspect of the present disclosure, there is provided a liner of an epitaxial reactor, including a lower body including an entrance stepped portion which is disposed on an upper end of one side of an outer side surface of the lower body and through which a source gas is introduced, a plurality of lower partitions disposed apart from each other on the entrance stepped portion, an upper body disposed on the lower body to face the lower body and including an entrance cover part forming a flow path which is interposed between the entrance stepped portion and the entrance cover part and through which the source gas is introduced, and a plurality of upper partitions disposed apart from each other on the entrance cover part, wherein the upper partitions are more densely disposed in both side portions than in a central portion of the entrance cover part.

The lower partitions may be disposed at both sides of the entrance stepped portion at predetermined intervals.

Some of the upper partitions may be disposed in a line with the lower partitions in the central portion of the entrance cover part in a direction in which the source gas is introduced.

Some of the upper partitions may be more densely disposed than the lower partitions in the both side portions of the entrance cover part.

Some of the upper partitions may be disposed in a line with the lower partitions in the both side portions of the entrance cover part in a direction in which the source gas is introduced.

Two or more of some of the upper partitions may be disposed between the lower partitions in the both side portions of the entrance cover part.

The upper partitions may be formed with the same thicknesses as the lower partitions.

Some of the upper partitions may be formed with greater thicknesses than the lower partitions in the both side portions of the entrance cover part.

Two or more of some of the upper partitions may be disposed between the lower partitions in the both side portions of the entrance cover part.

The upper partitions may be formed of a quartz material and integrally formed with the entrance cover part.

According to another aspect of the present disclosure, there is provided an epitaxial reactor including a susceptor on which a wafer is seated, a lower liner having an inner surface surrounding the susceptor, and an upper liner disposed on the lower liner to face the lower liner, wherein the lower liner includes an entrance stepped portion which is disposed on an upper end of one side of an outer side surface of the lower body and through which a source gas is introduced and a plurality of lower partitions disposed apart from each other on the entrance stepped portion, the upper liner includes an upper body disposed on the lower body to face the lower body and including an entrance cover part forming a flow path which is interposed between the entrance stepped portion and the entrance cover part and through which the source gas is introduced and a plurality of upper partitions disposed apart from each other on the entrance cover part, and the upper partitions are more densely disposed in both side portions than in a central portion of the entrance cover part.

Advantageous Effects

According to an embodiment, by disposing the upper partitions more densely on both side portions than a central portion of an entrance through which a source gas flows, it is possible to improve the flow straightness of the source gas flowing in both directions of a wafer and a thickness of an epi-layer over the entire wafer can be controlled uniformly.

DETAILED DESCRIPTION OF THE EMBODIMENTS

Hereinafter, embodiments will be described in detail with reference to the accompanying drawings.

Figure 1:
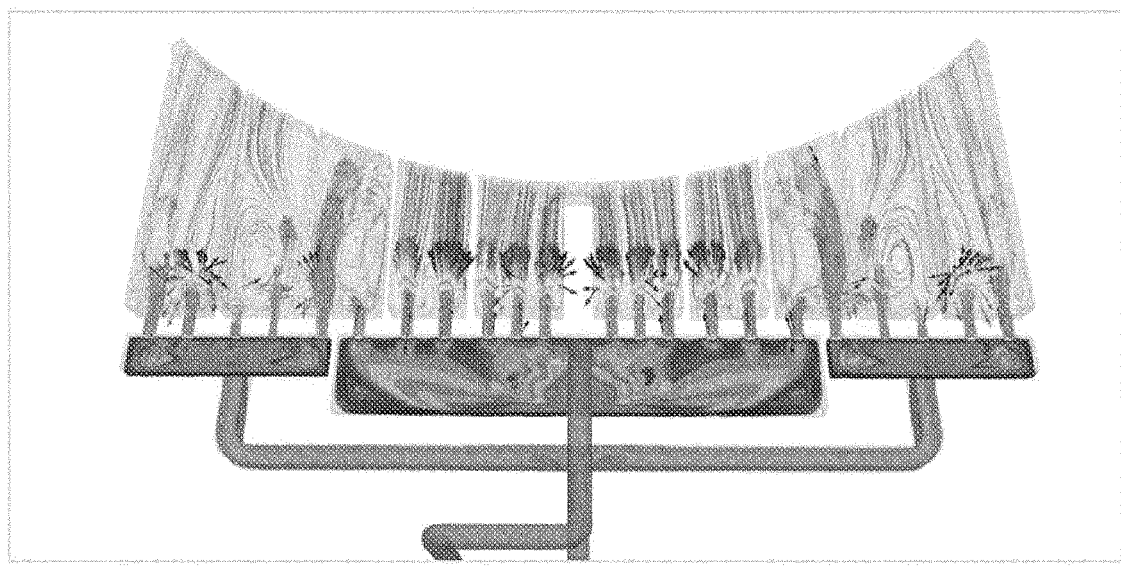
FIG. 1 is a view illustrating a flow of a source gas at an entrance of an epitaxial reactor according to a conventional technology.
Figure 2:
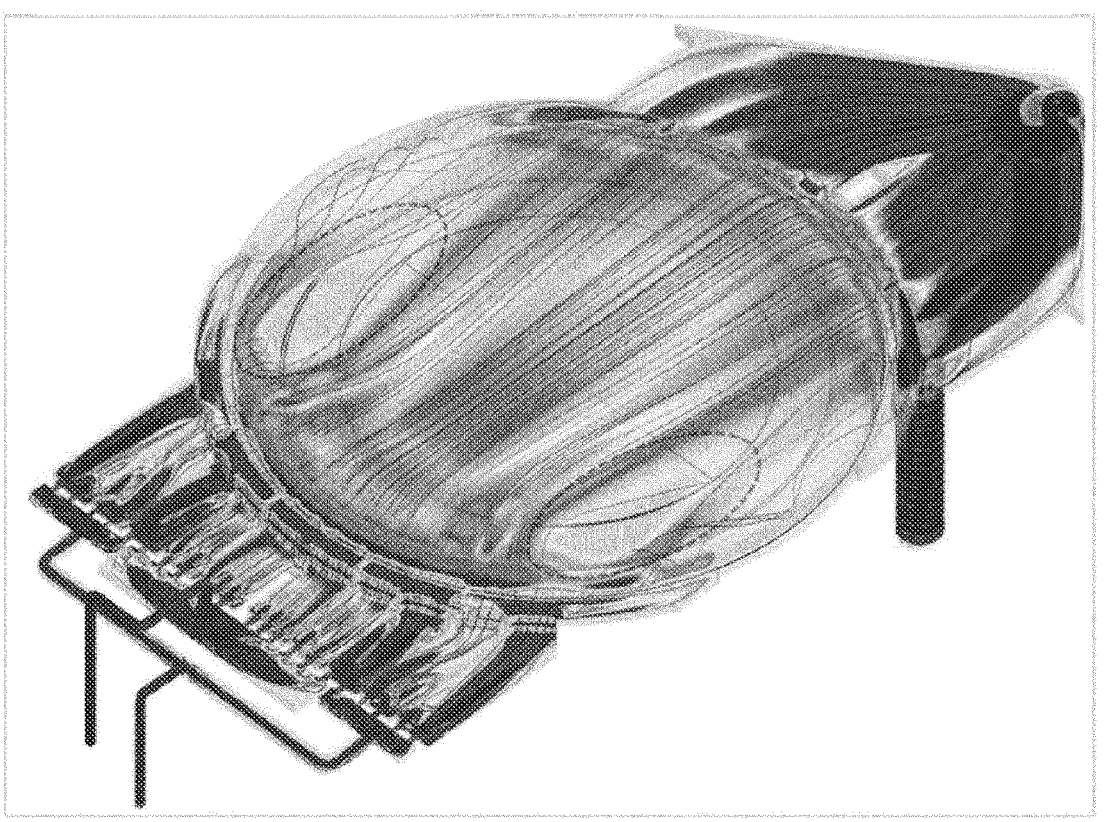
FIG. 2 is a view illustrating a flow of the source gas in an epitaxial reactor according to the conventional technology.
Figure 3:
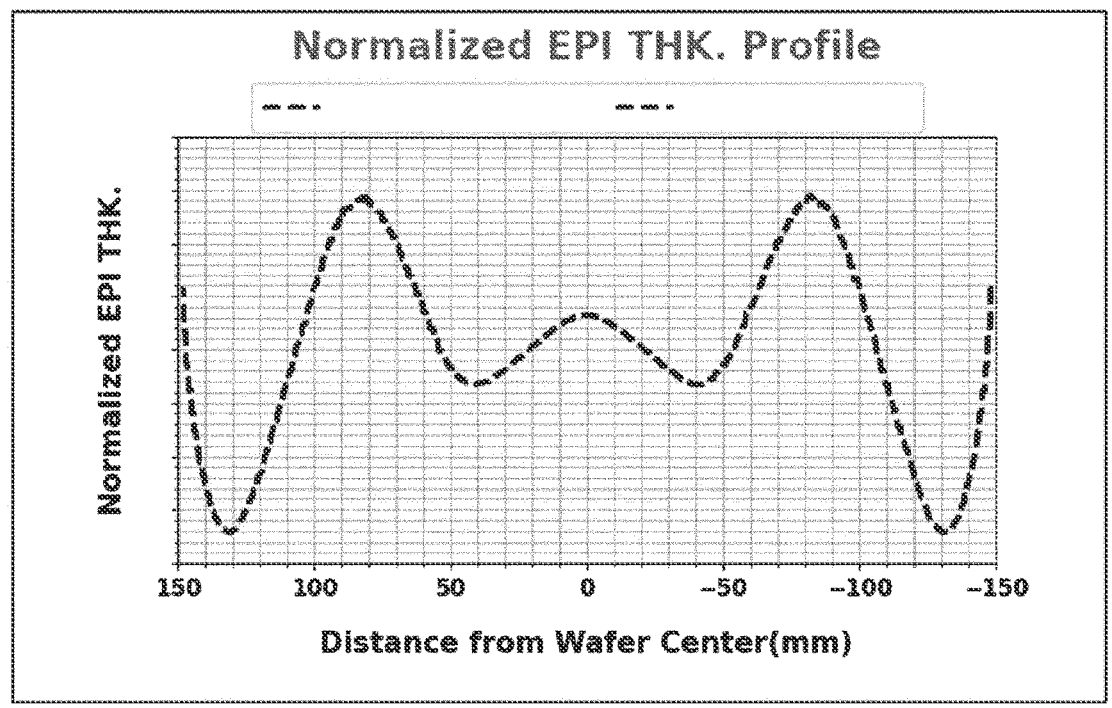
FIG. 3 is a graph showing a thickness of an epi-layer of a wafer manufactured in the epitaxial reactor according to the conventional technology.
Figure 4:
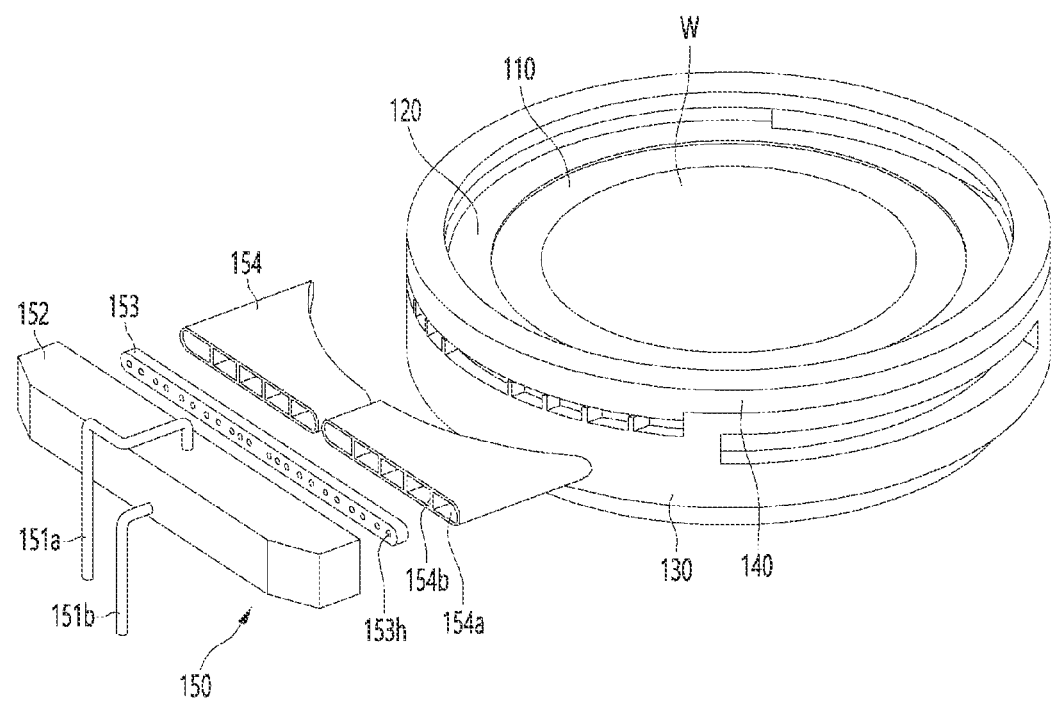
FIG. 4 is an exploded perspective view illustrating an epitaxial reactor according to one embodiment.

FIG. 4 is an exploded perspective view illustrating an epitaxial reactor according to one embodiment.

The epitaxial reactor according to one embodiment may be a single wafer processing type epitaxial reactor which processes semiconductor wafers one by one and include a susceptor 110 installed in a reaction chamber (not shown) formed by a lower dome and an upper dome, a preheat ring 120 provided on a circumference of the susceptor 110, a lower liner 130 and an upper liner 140 which are installed to surround the susceptor 110, a gas supply unit 150 which supplies a source gas into the reaction chamber, and a gas discharge unit (not shown) which discharges the gas passing through the reaction chamber.

The reaction chamber may be a space in which an epitaxial reaction occurs, the gas supply unit 150 may be provided at one side thereof, and the gas discharge unit (not shown) may be provided at the other side thereof.

The susceptor 110 may be formed in a circular support plate shape and formed of carbon graphite or carbon graphite coated with silicon carbide. The susceptor 110 may be disposed in the reaction chamber, and a wafer W may be seated on the susceptor 110. The susceptor 110 may be supported by a susceptor support unit (not shown) and move vertically in the reaction chamber.

The preheat ring 120 may serve to keep a temperature of the wafer W loaded on the susceptor 110 or a temperature of the source gas flowing to the wafer W constant and may be disposed along an inner circumferential surface of the lower liner 130 adjacent to the susceptor 110 to be coplanar with an upper surface of the susceptor 110 or an upper surface of the wafer W.

The inner circumferential surface of the lower liner 130 may be disposed to surround the susceptor 110, and the upper liner 140 may be disposed on the lower liner 130 to face the lower liner 130. Each of the lower liner 130 and the upper liner 140 includes partitions to guide gas to be uniformly introduced into the reaction chamber, which will be described in detail below.

The gas supply unit 150 may include two gas supply tubes 151a and 151b, an inject cap 152, a baffle 153, and an insert 154.

The gas supply tubes 151a and 151b may supply the source gas to the inject cap 152.

The inject cap 152 may include a plurality of spaces (not shown) isolated from each other in order to guide supply of the source gas.

One gas supply tube 151a may be configured to supply the source gas to one space 152a (see FIG. 6) positioned in a central portion of the inject cap 152, and the other gas supply tube 151b may be configured to supply the source gas to two spaces 152b and 152c (see FIG. 6) positioned in both side portions of the inject cap 152, but the present disclosure is not limited thereto.

The baffle 153 may be positioned between the inject cap 152 and the insert 154 and include a plurality of through holes 153b through which the source gas passes. The through holes 153b of the baffle 153 may be installed to correspond to or be aligned with the spaces 152a, 152b, and 152c (see FIG. 6) of the inject cap 152.

The insert 154 may include a plurality of flow paths 154a through which the source gas passes, and the plurality of flow paths 154a may be isolated from each other by partitions 154b. The flow paths 154a of the insert may be installed to correspond to or be aligned with the through holes 153b of the baffle like the through holes 153b.

In order to prevent a flow of the source gas from being seriously reduced at both sides of the wafer W even when the source gas is introduced into the reaction chamber through the gas supply unit 150, the partitions may be disposed at entrance sides of the lower liner 130 and the upper liner 140 to improve flow straightness of the source gas flowing both sides of the wafer W.

Figure 5:
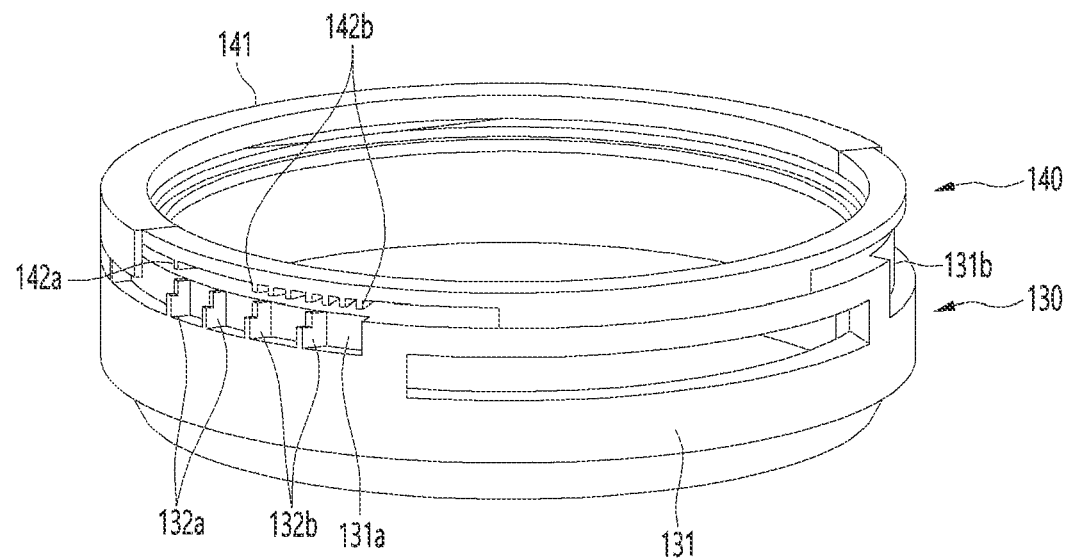
FIG. 5 is a partially cut-away perspective view illustrating a liner of a first embodiment.
Figure 6:
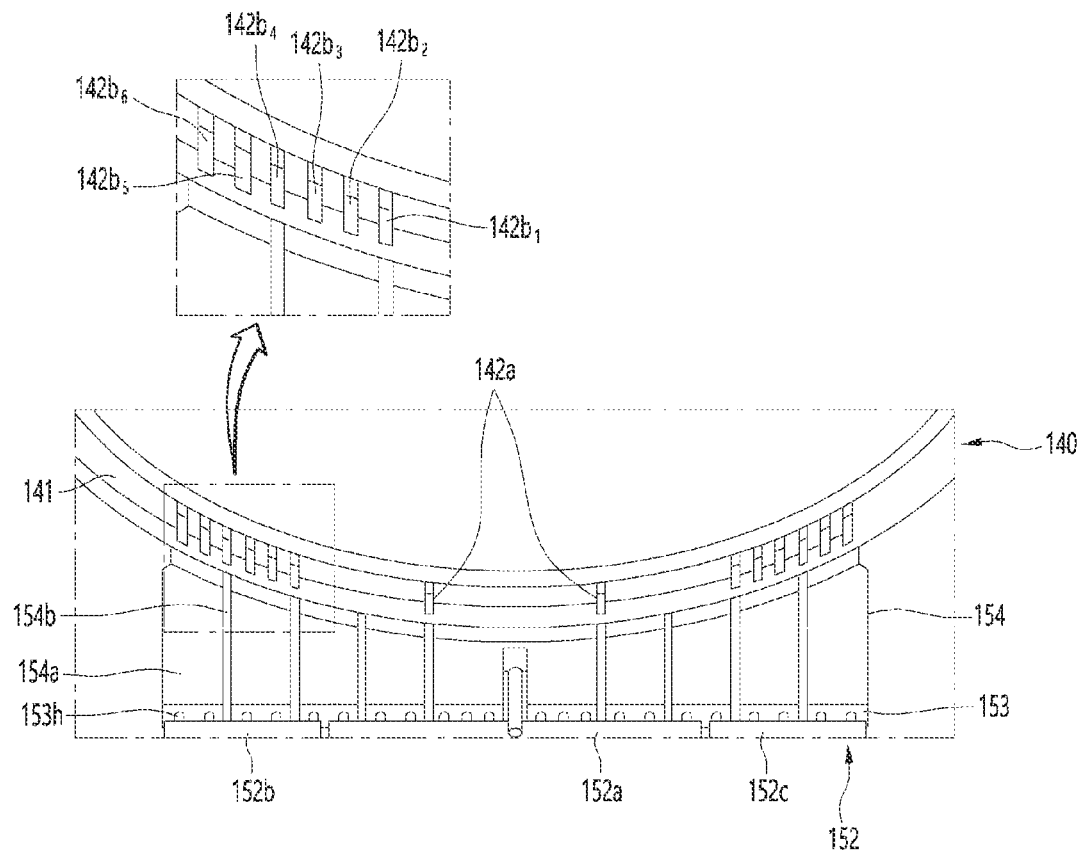
FIG. 6 is a schematic view illustrating a layout of upper partitions and lower partitions in the liner of the first embodiment.
Figure 7:
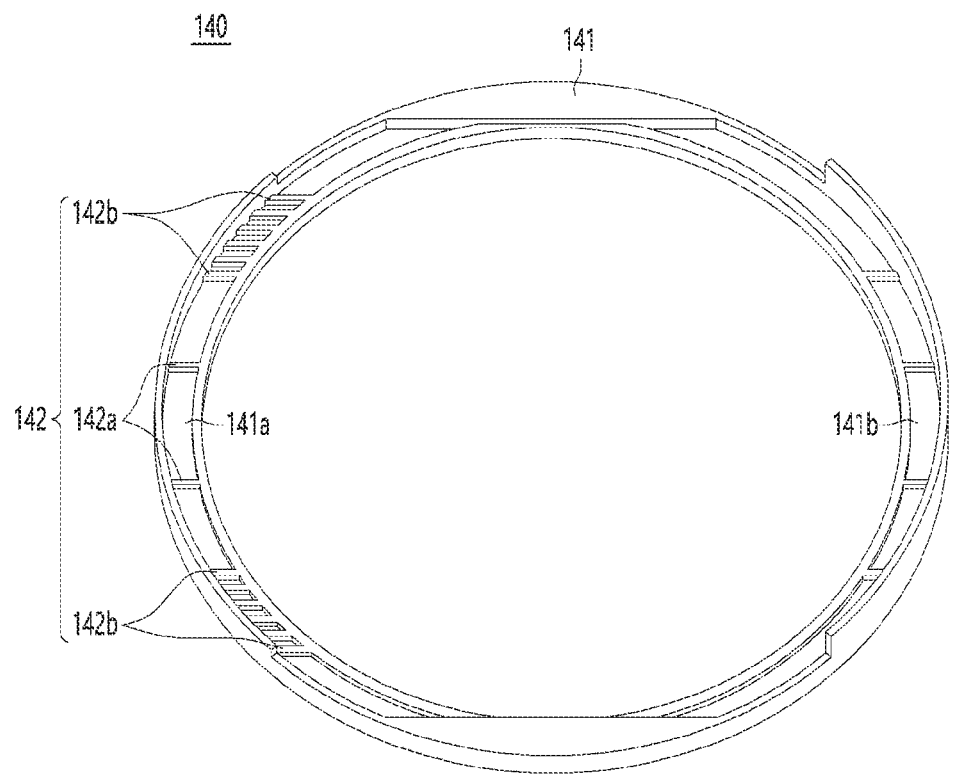
FIG. 7 is a bottom perspective view illustrating an upper liner included in the liner of the first embodiment.

FIG. 5 is a partially cut-away perspective view illustrating a liner of a first embodiment, FIG. 6 is a schematic view illustrating a layout of upper partitions and lower partitions in the liner of the first embodiment, and FIG. 7 is a bottom perspective view illustrating an upper liner included in the liner of the first embodiment.

In the liner of the first embodiment, lower partitions 132b of a lower liner 130 and upper partitions 142b of an upper liner 140 may be provided in order to improve flow straightness at an entrance through which a source gas is introduced, and the upper partitions 142b of the upper liner 140 may be more densely disposed in both side portions than in a central portion of the entrance through which the source gas is introduced.

The lower liner 130 includes a ring shaped lower body 131 including an entrance stepped portion 131a which is disposed at an upper end of one side of an outer side surface of the lower liner 130 and through which the source gas is introduced and an exit stepped portion 131b which is disposed at an upper end of the other side of the outer side surface and through which the source gas is discharged and a plurality of lower partitions 132a and 132b disposed apart from each other on the entrance stepped portion 131a. The lower body 131 and the lower partitions 132a and 132b may be integrally formed of a quartz material. An upper outer circumferential surface of the lower body 131 may be positioned to be coplanar with an upper surface of a susceptor 110 (see FIG. 4) or upper surface of a wafer W (see FIG. 4).

The lower partitions 132a and 132b may be disposed at both sides of the entrance stepped portion, that is, in a circumferential direction of the lower body 131 at predetermined intervals. The lower partitions 132a and 132b may be installed to correspond to or be aligned with partitions 154b (see FIG. 4) of an insert. The lower partitions 132a and 132b may be formed in stepped shapes with the same thicknesses.

For example, four first lower partitions 132a may be provided in a central portion of the entrance stepped portion 131a, two second lower partitions 132b may be disposed in each of both side portions of the entrance stepped portion 131a, and the first and second lower partitions 132a and 132b may be formed with the same thicknesses and formed in the same shapes.

The upper liner 140 is disposed on the lower liner 130 to face an upper side of the lower body 131 and includes a ring shaped upper body 141 that has an entrance cover part 141a forming a flow path which is interposed between the entrance stepped portion 131a and the entrance cover part 141a and through which the source gas is introduced and an exit cover part 141b forming a flow path which is interposed between the exit stepped portion 132b and the exit cover part 141b and through which the source gas is discharged, and a plurality of upper partitions 142a and 142b disposed to be spaced apart from the entrance cover part 141a. The upper body 141 and the upper partitions 142a and 142b may be integrally formed of a quartz material.

The upper partitions 142a and 142b may be provided at both sides of the entrance cover part 141a, that is, in a circumferential direction of the upper body 141 to be spaced apart from each other and more densely provided in both side portions than in a central portion of the entrance cover part 141a. The upper partitions 142a and 142b may be formed in quadrangular shapes with the same thicknesses.

For example, two first upper partitions 142a may be provided in the central portion of the entrance cover part 141a, six second upper partitions 142b may be provided in each of both side portions of the entrance cover part 141a, and the first and second upper partitions 142a and 142b may be formed with the same thicknesses and formed in the shapes.

According to the liner of the first embodiment formed as described above, the first upper partitions 142a are disposed in a line with some of the first lower partitions 132a in the central portion of the entrance through which the source gas is introduced. However, some second upper partitions $142b_1$ and $142b_4$ of the second upper partitions 142b may be disposed in a line with the second lower partitions 132b in both side portions of the entrance through which the source gas is introduced, and two of the other second upper partitions $142b_2$, $142b_3$, $142b_5$, and $142b_6$ of the second upper partitions 142b may be disposed between each of gaps between the second lower partitions 132b. Accordingly, flow straightness can be further improved at both side portions of the entrance through which the source gas is introduced, and an epi-layer with a uniform thickness on an entire wafer may be manufactured.

Figure 8:
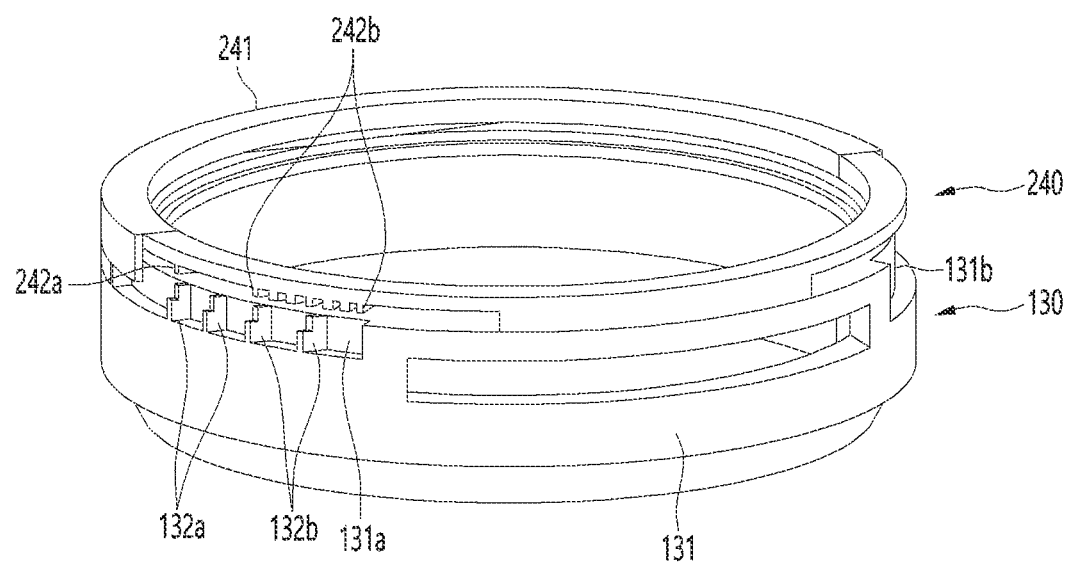
FIG. 8 is a partially cut-away perspective view illustrating a liner of a second embodiment.
Figure 9:
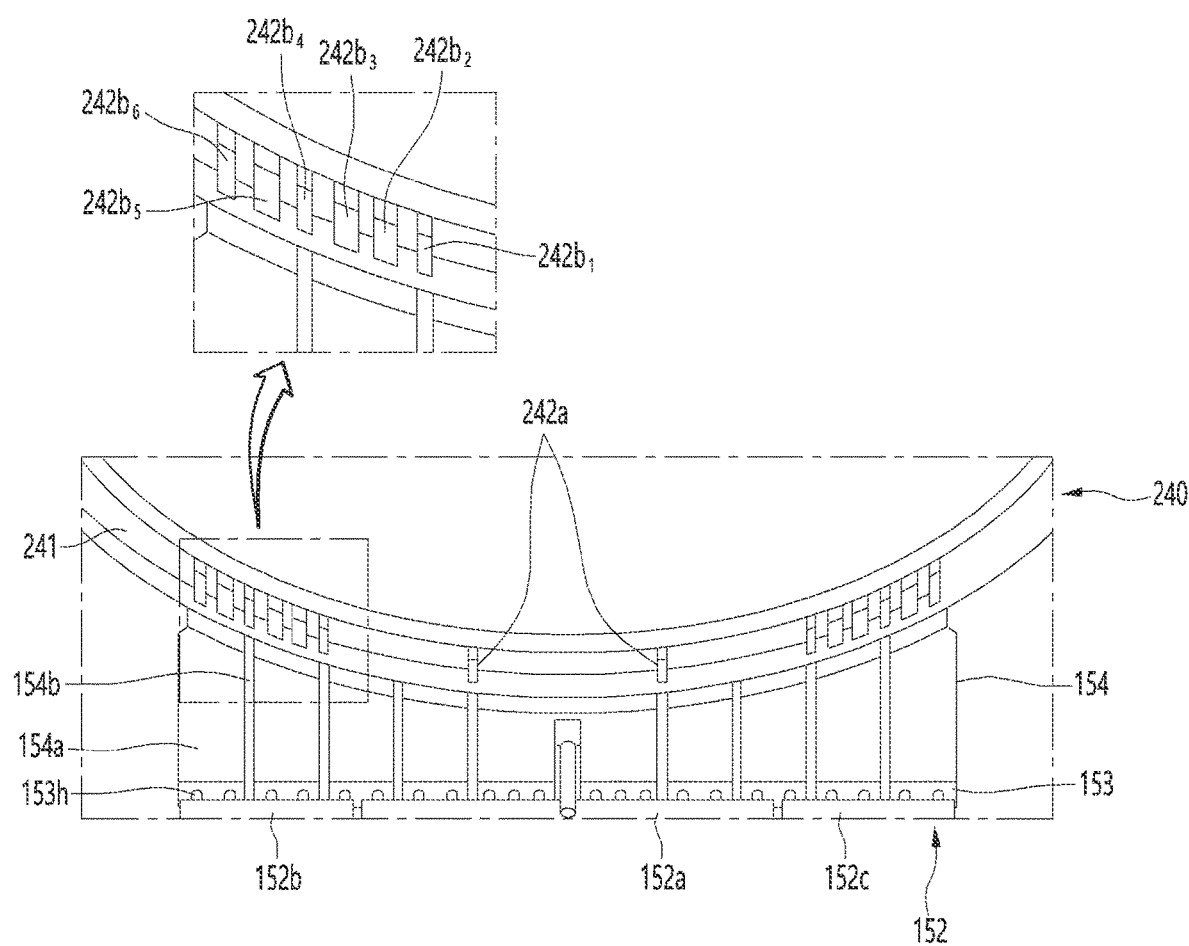
FIG. 9 is a schematic view illustrating a layout of upper partitions and lower partitions in the liner of the second embodiment.
Figure 10:
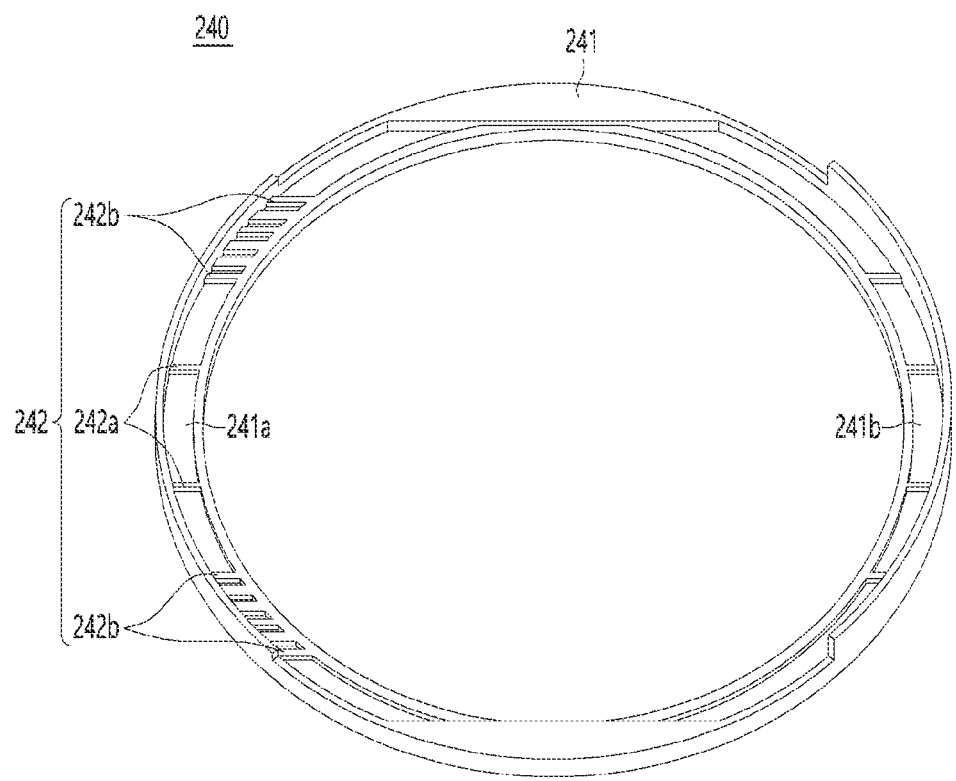
FIG. 10 is a bottom perspective view illustrating an upper liner included in the liner of the second embodiment.

FIG. 8 is a partially cut-away perspective view illustrating a liner of a second embodiment, FIG. 9 is a schematic view illustrating a layout of upper partitions and lower partitions in the liner of the second embodiment, and FIG. 10 is a bottom perspective view illustrating an upper liner included in the liner of the second embodiment.

According to the liner of the second embodiment, like the first embodiment, second upper partitions 242b positioned in both side portions of an entrance through which a source gas is introduced are more densely formed than first upper partitions 242a positioned in a central portion of the entrance through which the source gas is introduced, and more particularly, thicknesses of some of the second upper partitions 242b disposed between second lower partitions 132b may be greater than those of the other second upper partitions 242b.

In a lower liner 130, first lower partitions 132a disposed in a central portion of an entrance stepped portion 131a and the second lower partitions 132b disposed in both side portions of the entrance stepped portion 131a may be formed with the same thicknesses.

In an upper liner 240, the first upper partitions 242a disposed in a central portion of an entrance cover part 241a are formed with the same thicknesses as the lower partitions 132a and 132b. However, the second upper partitions 242b disposed in both side portions of an entrance cover part 241a may be formed with thicknesses which are the same as or greater than thicknesses of the lower partitions 132a and 132b.

For example, some second upper partitions $242b_1$ and $242b_4$ of the second upper partitions 242b are formed with the same thicknesses as the second lower partitions 132b and disposed in a line with the second lower partitions 132b, and the other second upper partitions $2421b_2$, $242b_3$, $242b_5$, and $242b_6$ of the second upper partitions 242b may be formed with thicknesses greater than thicknesses of the second lower partitions 132b, and two of the second upper partitions 242$b_2$, 242$b_3$, 242$b_5$, and 242$b_6$ may be disposed between each of gaps between the second lower partitions 132$b$.

Accordingly, when compared to the first embodiment, in the liner of the second embodiment, since the upper partitions 242$b$ positioned between the lower partitions 132$b$ in both side portions of the entrance through which the source gas is introduced are formed with the greater thicknesses, flow straightness can be improved at both side portions of the entrance through which the source gas is introduced, and an epi-layer with a uniform thickness on an entire wafer can be manufactured.

Figure 11:
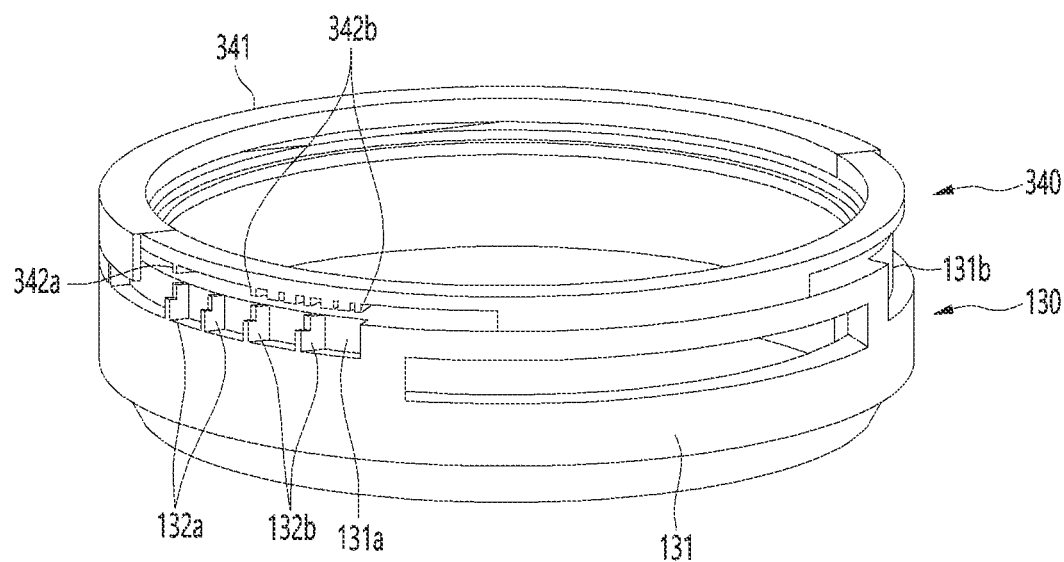
FIG. 11 is a partially cut-away perspective view illustrating a liner of a third embodiment.
Figure 12:
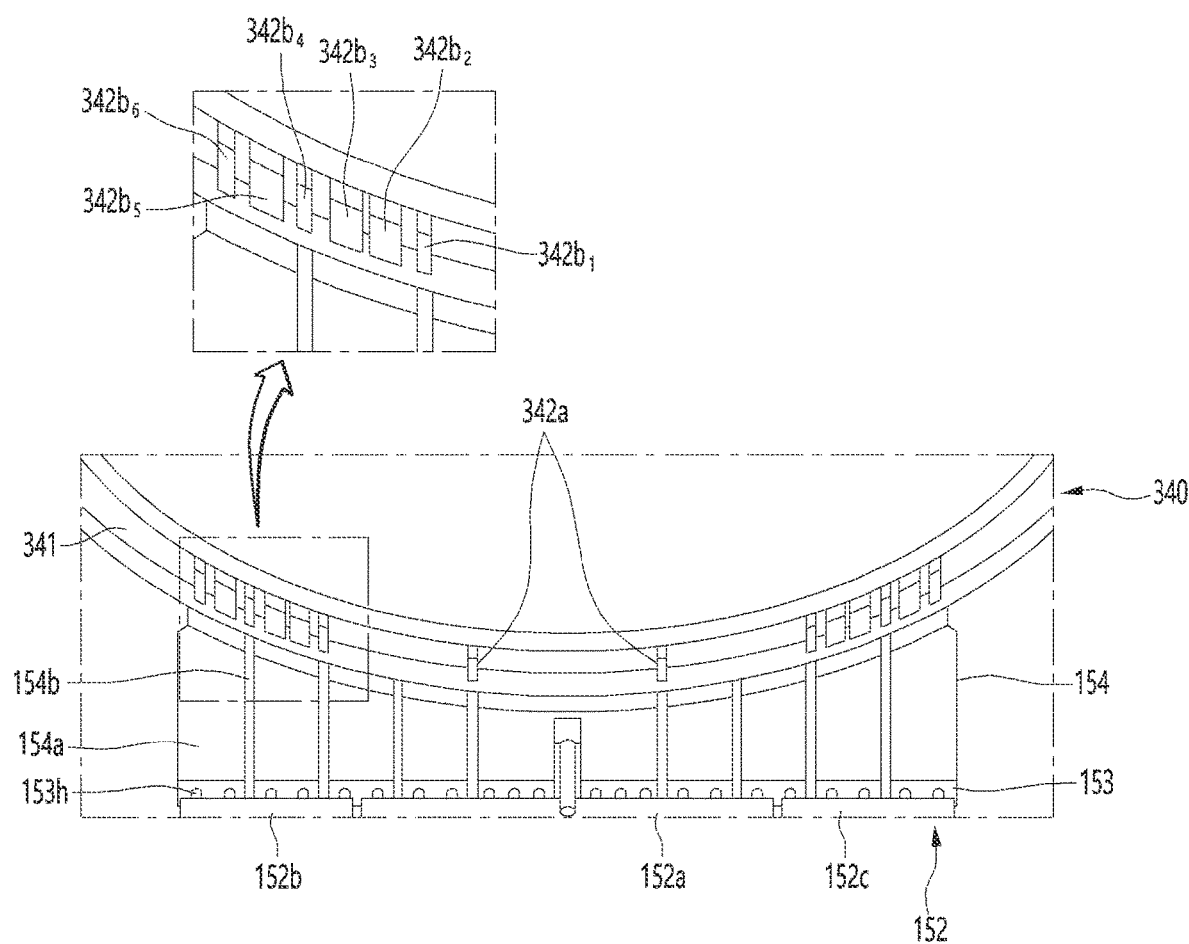
FIG. 12 is a schematic view illustrating a layout of upper partitions and lower partitions in the liner of the third embodiment.
Figure 13:
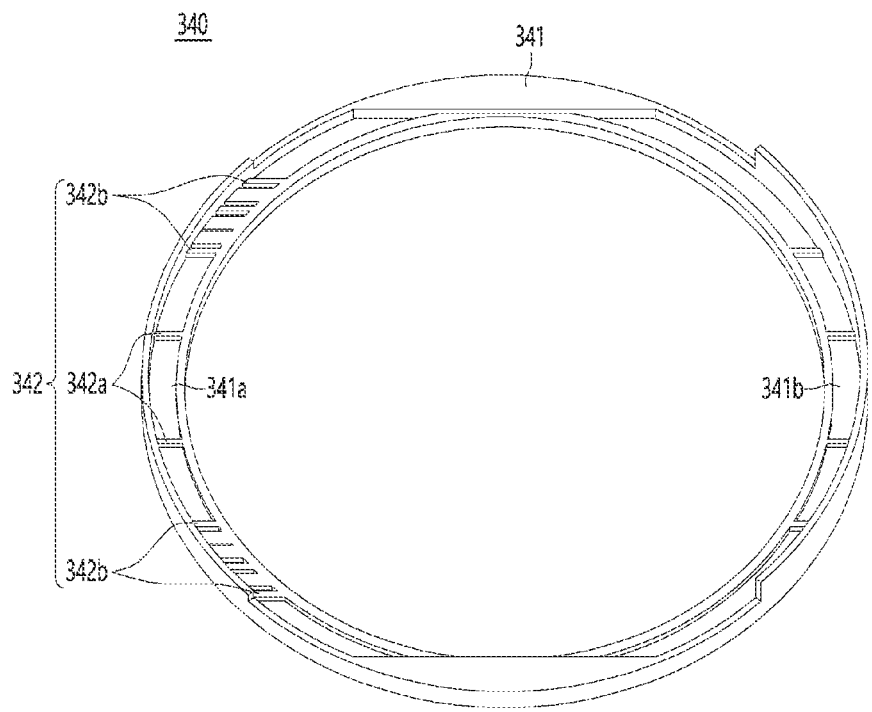
FIG. 13 is a bottom perspective view illustrating an upper liner included in the liner of the third embodiment.

FIG. 11 is a partially cut-away perspective view illustrating a liner of a third embodiment, FIG. 12 is a schematic view illustrating a layout of upper partitions and lower partitions in the liner of the third embodiment, and FIG. 13 is a bottom perspective view illustrating an upper liner included in the liner of the third embodiment.

According to the liner of the third embodiment, the liner is formed to be the same as the liner of the second embodiment, and some of second upper partitions 342$b$ positioned between second lower partitions 132$b$ may be formed with thicknesses greater than those of the second embodiment.

As the thicknesses of the second upper partitions 342$b$ disposed between the second lower partitions 132$b$ increase, a flow path, through which a source gas flows, is narrowed, and thus flow straightness may be further improved at both side portions of an entrance through which the source gas is introduced. However, the narrowed flow path acts as flow resistance of the source gas, and thus a flow rate may be lowered. Accordingly, the thicknesses of the second upper partitions 342$b$ positioned between the second lower partitions 132$b$ may be properly adjusted on the basis of a simulation result.

The liner of the third embodiment is formed like the liner of the second embodiment, and the detailed description will be omitted.

Figure 14:
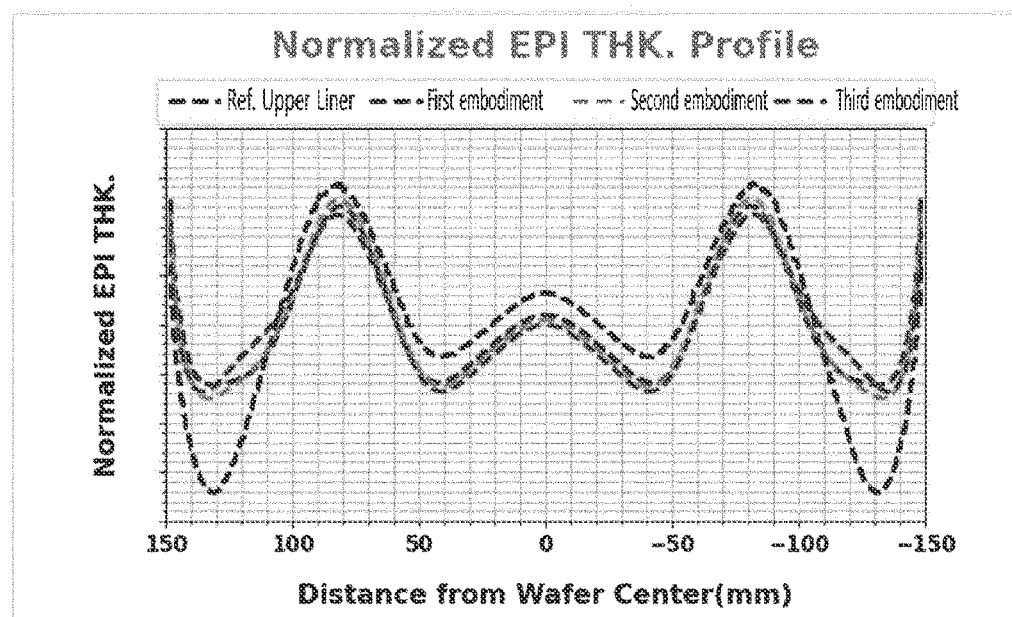
FIG. 14 is a graph showing thicknesses of epi-layers of epi-wafers manufactured in epitaxial reactors according to the conventional technology and the first, second, and third embodiments.

FIG. 14 is a graph showing thicknesses of epi-layers of epi-wafers manufactured in epitaxial reactors according to the conventional technology and the first, second, and third embodiments.

In an epi-wafer manufactured in the conventional epitaxial reactor, since a liner without an upper partition is applied, and a flow is relatively weakened at both side portions of an entrance through which a source gas is introduced, thicknesses of an epi-layer at both side portions of a wafer are very thin, and it can be seen that a thickness deviation of the epi-layer is large on an entire wafer.

However, in an epi-wafer manufactured in the epitaxial reactor according to each of the first, second, and third embodiments, since the liner, in which the upper partitions are more densely formed in the both side portions than in the central portion of the entrance through which the source gas is introduced, is applied, and flow straightness is improved in both side portions of the entrance through which the source gas is introduced, it can be seen that the thicknesses of the epi-layer in both side portions of the wafer are greater than those of the conventional case, and a thickness deviation of the epi-layer on the entire wafer is small.

However, in the first, second, and third embodiments, although thicknesses of some of the upper partitions increase gradually, it can be seen that the thicknesses of the epi-layer in both side portions of the wafer are improved similarly when compared to the conventional case.

The above-described descriptions are merely an example of the technological spirit of the present disclosure, and various modifications and variations may be made by those having ordinary skill in the art to which the present disclosure pertains without departing from the essential characteristics of the present disclosure.

Therefore, the embodiments disclosed in the present disclosure are not intended to limit the technological spirit of the present disclosure, but the embodiments are intended to describe, and the spirit and scope of the present disclosure is not limited by such embodiments.

The protection scope of the present disclosure should be construed by the following claims, and all technological spirits within the equivalent scope thereof should be construed as being included in the scope of right of the present disclosure.

What is claimed is:

1. A liner of an epitaxial reactor, comprising:
a lower body including an entrance stepped portion which is disposed on an upper end of one side of an outer side surface of the lower body and through which a source gas is introduced and an exit stepped portion which is disposed at an upper end of the other side of the outer side surface and through which the source gas is discharged;
a plurality of lower partitions disposed on the entrance stepped portion to be spaced apart from each other;
an upper body disposed on the lower body to face the lower body and including an entrance cover part forming a flow path which is interposed between the entrance stepped portion and the entrance cover part and through which the source gas is introduced and an exit cover part forming a flow path which is interposed between the exit stepped portion and the exit cover part and through which the source gas is discharged; and
a plurality of upper partitions disposed apart from each other on the entrance cover part and the exit cover part,
wherein the upper partitions are more densely disposed in both side portions of the entrance cover part than in a central portion of the entrance cover part and in the exit cover part, and
wherein some of the upper partitions are formed with greater thicknesses than the lower partitions in the both side portions of the entrance cover part.

2. The liner of claim 1, wherein the lower partitions are disposed at both sides of the entrance stepped portion at predetermined intervals.

3. The liner of claim 1, wherein some of the upper partitions are disposed in a line with the lower partitions in the central portion of the entrance cover part in a direction in which the source gas is introduced.

4. The liner of claim 1, wherein some of the upper partitions are more densely disposed than the lower partitions in the both side portions of the entrance cover part.

5. The liner of claim 4, wherein some of the upper partitions are disposed in a line with the lower partitions in the both side portions of the entrance cover part in a direction in which the source gas is introduced.

6. The liner of claim 4, wherein two or more of some of the upper partitions are disposed between the lower partitions in the both side portions of the entrance cover part.

7. The liner of claim 1, wherein the others of the upper partitions are formed with the same thicknesses as the lower partitions in the central portion of the entrance cover part.

8. The liner of claim 1, wherein at least two or more of some of the upper partitions are disposed between the lower partitions in the both side portions of the entrance cover part.

9. The liner of claim 1, wherein the upper partitions are formed of a quartz material and integrally formed with the entrance cover part.

\* \* \* \* \*